United States Patent [19]

Mitsuo et al.

[11] 4,131,517
[45] Dec. 26, 1978

[54] SURFACE TREATING PROCESS FOR COPPER FOIL FOR USE IN PRINTED CIRCUIT

[75] Inventors: Takahashi Mitsuo, Tokyo; Kawasumi Yoshio, Urawa, both of Japan

[73] Assignee: Nippon Mining Co., Ltd., Tokyo, Japan

[21] Appl. No.: 803,275

[22] Filed: Jun. 3, 1977

[51] Int. Cl.$^2$ .................. C25D 7/06; C25D 5/48; C25D 5/10

[52] U.S. Cl. .................. 204/27; 204/35 R; 204/40; 204/44; 204/56 R; 156/151

[58] Field of Search .............. 204/27, 35 R, 38 E, 204/40, 44, 56 R; 156/151

[56] References Cited

U.S. PATENT DOCUMENTS

| | | | |
|---|---|---|---|
| 1,750,092 | 3/1930 | Crawford et al. | 204/44 |
| 3,247,082 | 4/1966 | DuRose | 204/44 |
| 3,585,010 | 6/1971 | Luce et al. | 204/44 |

*Primary Examiner*—John H. Mack
*Assistant Examiner*—William Leader
*Attorney, Agent, or Firm*—William E. Jackson

[57] ABSTRACT

A surface treating process for a copper foil for use in a printed circuit, in which the surface of a copper foil is subjected to a cathodic treatment in an electrolytic bath of an aqueous solution of sulfuric acid, containing nickel and copper ions, with the copper foil being used as a cathode.

The copper foil thus subjected to cathodic treatment is brought into contact with an aqueous solution containing one of sodium hexametaphosphate α-nitroso R salt, 2-mercaptobenzothiazole, rubeanic acid, anthranilic acid, benzenesulfonamide, phthalic acid, potassium dichromate.

7 Claims, No Drawings

SURFACE TREATING PROCESS FOR COPPER FOIL FOR USE IN PRINTED CIRCUIT

BACKGROUND OF THE INVENTION

Field of the Invention

This invention relates to a surface treating process for a copper foil for use in a printed circuit, and more particularly to a cathodic treatment using a copper foil as a cathode.

Description of the Prior Art

Hitherto, the surface treatment of a copper foil for use in a printed circuit suffered from the following shortcomings: poor bonding strength, insufficient chemical resistance and poor adaptability to electro-plating. More particularly the poor chemical resistance resulted in a side etching phenomenon during an etching process, after printing a circuit. In addition, poor adaptability to the electro-plating resulted in undesirable appearance of a printed curcuit.

SUMMARY OF THE INVENTION

It is accordingly a principal object of the present invention to provide a surface treating process for a copper foil for use in a printed circuit, which provides desired bonding strength, high chemical resistance, and good adaptability to electro-plating.

According to the present invention, there is provided a surface treating process for a copper foil for use in a printed circuit, in which the surface of a copper foil is subjected to a cathodic treatment in an electrolytic bath of a sulfuric acid aqueous solution containing nickel and copper, with the copper foil being used as a cathode.

According to another aspect of the present invention, the copper foil thus cathode treated is brought into contact with an aqueous solution containing one of hexametaphosphoric acid soda, α-nitroso R salt, 2-mercaptobenzothiazole, rebeanic hydro-acid, anthranilic acid, benzensulfonamide, phthalic acid, and potassium bichromate.

DESCRIPTION OF THE PREFERRED EMBODIMENTS

The process according to the present invention will now be described in more detail, hereunder. A copper foil derived according to rolling or electrolysis is subjected to a cathodic treatment in a sulfuric acid bath containing polyacrylamide (PAA), nickel ions, and copper ions, with the copper foil being used as a cathode and a copper plate as an anode. It does not have effect on the gist of the present invention to delete the polyacrylamide (PAA) from the sulfuric acid bath. However, in case of adding the polyacrylamide (PAA) thereto, the range of the permissible sulfuric acidity of the bath is relatively wide. According to this process, there may be derived an electro-deposited surface. The mechanism of the production of an electro-deposited surface is not clear. However, thin, uniform electro-deposited layer may be obtained due to the presence of nickel ions and copper ions. The color of a deposited layer is dark brown, and the deposited layer affords a metallic gloss. The deposited layer is not attended with powdering. The composition of an electro-deposited layer is not confirmed. However, in case the copper concentration is too high, then a deposited surface exhibits an oxidized copper color, and in case the copper concentration is too low, then a metallic nickel color is obtained. Meanwhile, when the thickness of an electro-deposited layer is increased by extending the duration of a cathodic treatment, then a ratio of copper to nickel contained in a deposited layer which has been brushed out in water stream, or, in other words, peeled by the pressurized water from the copper foil, is found to be about 0.5 to 1. As a result, the deposited layer is considered to consist of an alloy or an oxide which essentially comprises nickel and copper. The electro-deposited layer thus obtained according to the present invention is entirely different in its nature from an electro-deposited layer obtained according to a cathodic treatment in a copper sulfate - sulfuric acid system bath which has been used hitherto.

Any soluble inorganic copper compounds may be used as a copper ion source. However, copper sulfate is most recommendable. Preferable copper ion concentration depends on a nickel ion concentration and a current density. A range from 3 g/liter to 15 gliter is preferable. A range from 3 to 6 g/liter is preferable in case a nickel ion concentration ranges from 20 g/liter to 70 g/liter.

The preferable molecular weight and concentration of polyacrylamide ranges from 100,000 to 1,000,000, and 0.5 g/liter to 15 g/liter, respectively.

Any soluble inorganic nickel compounds may be used as a nickel source. However, nickel ion sulfate is most recommendable. The concentration of nickel ion has no limitation. However, if the concentration of nickel ion is lower than 10 g/liter under a certain condition, uniform electro-deposited layer can not be obtained. A preferable range of concentration of nickel ion is between 20 and 70 g/liter.

In case the acidity of a bath is below PH 3, then a deposited layer with the same results as those stated in the above paragraph may be obtained, while a range of 5 to 200 g/liter of sulfuric acid is preferable. In case the polyacrylamide (PAA) is not used, the same results may be obtained if the acidity of the bath is between PH 1.5 and 3.5. Particularly the range from PH 2.2 to PH 3.0 is preferable. Adding Glauber's salt thereto is effective for increasing ionization degree of a bath.

The preferable electrolytic conditions in the aforesaid bath composition are a current density of 200 to 500 $A/m^2$ and the electrolysis time of 20 to 60 seconds. The temperature of a bath is preferably a room temperature, although no limitation is imposed thereon. Also, no limitation is imposed on a cyclic flow rate of a bath, and hence a cyclic flow rate may be zero. It is preferable that an electrolytic bath according to the present invention be used after an electrolysis pretreatment described later in greater detail using a copper plate as an anode, at a current density of 100 to 300 $A/m^2$, current concentration of 4 to 8 A/liter (electrolyte), and an amount of current of 5 to 10 A hr.

The copper foil subjected to a cathodic treatment may be used as a product, as it is. It was found that a copper foil makes a time-dependent change in its peeling strength, surface grain and color tone, during storage, as shown in Table 1.

Table 1

|  | Immediately after cathodic treatment | After 30 days |
| --- | --- | --- |
| Peeling strength (kg/cm) | 1.50 ~ 1.70 | 1.00 ~ 1.30 |
| Surface grain diameter | Grains of less than $\frac{1}{100}$ μ are present | No grain of less than $\frac{1}{100}$ μ* |
| Color tone | Dark brown having | Redish brown |

Table 1-continued

| | Immediately after cathodic treatment | After 30 days |
|---|---|---|
| | | purple color |

*It appears that smaller grains join larger grains, presenting a smooth surface. (30,000 to 60,000 X)

For the purpose of suppressing the aforesaid time-dependent change, a close study was given to a copper ion detecting reagent and a crystalline-growth-preventive agent. The following was found to be satisfactory for this purpose: sodium hexametaphosphate; α-nitroso R salt; 2-mercaptobenzothiazole; rubeanic acid; anthranilic acid; benzensulfonamide; phthalic acid; and potassium dichromate.

According to the present invention, a copper foil subjected to a cathodic treatment is brought into contact with an aqueous solution of one of the aforesaid reagents for 60 to 120 seconds. This treatment precludes a time-dependent change of a copper foil, when allowed to stand in a room. The table 2 summarizes the effects of suppression of a time-dependent change and the effective minimum concentration of the reagent. Meanwhile, for the treatment, a copper foil was dipped in the reagent at a room temperature for 120 seconds, followed by water rinsing.

Table 2

| Reagent | Effective minimum concentration | After 30 days | | |
|---|---|---|---|---|
| | | Peeling-strength reduction (%) | Grains of less than 0.001μ | Change in color tone |
| Sodium-hexametaphosphate | 1.0 g/l | 2 – 3 | Some amount present | None |
| α-nitro R salt | 0.05 g/l | 2 – 3 | Some amount present | None |
| 2-Mercapto-benzothiazole | | 3 – 5 | Almost none | None |
| Rubeanic acid | 0.05 g/l | 5 – 10 | Almost none | Somewhat reddish |
| Anthranilic acid | 0.05 g/l | 5 – 10 | Almost none | Somewhat reddish |
| Benzensulfon-amide | 0.05 g/l | 3 – 5 | Some amount present | None |
| Phthalic acid | 1.0 g/l | 5 – 10 | None | Somewhat reddish |
| Potassium dichromate | 0.05 g/l | 2 – 3 | Some amount present | None |

In case a pretreatment for a rolled copper foil as later described is carried out, prior to the surface treatment of an ordinary rolled copper foil, then there may be achieved an activated copper foil adapted for use in a printed circuit, which affords good adhesiveness, excellent electrical characteristic after etching, and freedom of uneven color or powdering. In addition, the process according to the present invention provides a copper foil affording an increased bonding strength and high chemical resistance and adaptability to electro-plating. In the case of poor chemical resistance, when etching is applied to a copper-laminated plate, after a circuit-printing process, so called "side etching" troubles arise, that is, the side edge of a non-removed portion is etched. In addition, in the case of poor adaptability to electro-plating results in an unsatisfactory appearance. Thus, these factors are of supreme importance in the field of a printed circuit. The above-mentioned pretreatment will be described as follows. Firstly, a rolled copper foil is subjected to a cleaning process such as degressing, and then copper ions are degreasing, in a known bath and operational conditions, with the aforesaid copper foil being used as a cathode, at a current density below a limit current density, which is known as an upper limit of current density for metallic ions in a solution to be deposited as a metal or an alloy. In this case, any well-known electrolytic bath may be used, so long as copper ions are deposited. For instance, there may be used an acid bath such as copper sulfate bath or cupric borofluoride bath, a neutral bath such as copper pyrophosphate bath and an alkaline bath such as copper cyanide bath, which are all well known, and neutral - alkalline bath such as a copper. The electrolytic condition may be suitably selected commensurate with the specific bath used, so as to achieve a copper deposit on the surface of a rolled copper foil. The degree of the copper deposition may be such as to be visually recognizable as a copper deposited layer on the entire surface of a copper foil.

According to the above-mentioned pretreatment the entire surface of a rolled copper foil may be activated uniformly.

The rolled copper foil thus subjected to the ordinary electro-depositing treatment according to the aforesaid pretreatment is then subjected to a cathodic treatment process of the present invention, with a copper plate being used as an anode, so that an electro-deposited layer may be formed on the surface of a copper foil.

The following examples are illustrative of the features of the process according to the present invention.

EXAMPLE 1

An electrolytic treatment was applied to a rolled and electrolytic copper foil of 35 μ in thickness in a electrolytic bath containing 16 g/liter of $CuSO_4.5H_2O$, 225 g/liter of $NiSO_4.6H_2O$, and PH 2.3 at a bath temperature of 30° C, a current density of 360 A/m$^2$, and electrolysis time of 60 seconds, thereby providing an electro-deposited surface or layer. The electro-deposited surface after water rinsing and drying exhibited dark-brown, clean appearance free of powdering or uneven color.

EXAMPLE 2

An electrolytic treatment was applied to a rolled and electrolytic copper foil of 35 μ in thickness in a electrolytic bath containing 16 g/liter of $CuSO_4.5H_2O$, 225 g/liter of $NiSO_4.6H_2O$, 1 g/liter of polyacrylamide (700,000 molecular weight), 5 g/liter of $H_2SO_4$ and 50 g/liter of $Na_2SO_4$ at a bath temperature of 30° C, a current density of 250 A/m$^2$, and electrolysis time of 60 seconds, thereby providing an electro-deposited surface or layer. The electro-deposited surface after water rinsing and drying exhibited dark-brown, clean appearance free of powdering or uneven color.

EXAMPLE 3

Copper foils obtained in Examples 1 and 2 were subjected to water rinsing and drying, after which the copper foils were superposed on substrate films consisting of a polyimide (e.g., films available under the tradename of Kapton) film coated with epoxy adhesive, and then heated under pressure, so that a copper-bonded film for use in a printed circuit was prepared. The table 3 represents the results of peeling strength and presence of residual matter thereof after etching. In this table, the surface condition of a copper foil prior to the bonding is shown, as well.

Table 3

|  | Rolled copper foil | Electrolytic copper foil |
|---|---|---|
| EXAMPLE 1 | | |
| Peeling strength | 1.45 | 1.90 |
| Residual matter after etching | None | None |
| Powdering of copper foil surface prior to bonding | None | None |
| Uneven color on surface of copper foil prior to bonding | None | None |
| EXAMPLE 2 | | |
| Peeling strength | 1.50 | 1.70 |
| Residual matter after etching | None | None |
| Powdering of copper foil surface prior to bonding | None | None |
| Uneven color on surface copper foil prior to bonding | None | None |

Note:
1) The peeling test in the above table was subjected according to a process in which the copper foil was peeled along with the polyimide film surface, i.e., in the direction of 180°.
2) The powdering test was given by bonding a commercially available adhesive tape available under the trademark of Scotch, followed by peeling. Then, particles adhering to the tape were observed.

As is clear from the above table, the copper foil for use in a printed circuit which has been prepared according to the process of the invention is superior in adhesiveness to an organic adhesive and free of residual matter and hence excellent electrical characteristic, after etching. In addition, the copper foil according to the present invention is free of uneven color and powdering, presenting good appearance.

EXAMPLE 4

A rolled copper foil having a thickness of 35 μ was dipped for 30 seconds in a cleaning solution obtained by deluting a kilinse solution (385 volume parts of $H_2SO_4$, 165 parts of $HNO_3$, 55 volume parts of HCl, and 440 volume parts of $H_2O$) with pure water of three times the volume of the aforesaid kilinse solution. After dipping, the surface of the copper foil was subjected to electrodeposition in an electrolytic bath containing 180 g/liter of $CuSO_4.5H_2O$ and 200 g/liter of $H_2SO_4$, and maintained at 60° ± 2 C, with the aforesaid copper foil being used as a cathode, at a current density of 500 A/m² and a bath cyclic flow rate of 0.8 cm/second for the duration of 60 seconds. Then, the copper foil was subjected to the treatment as described with reference to Example 2. No uneven color and powdering was observed on the surface of the copper foil. As in the preceding examples, the copper foil was bonded to a polyimide film to prepare a copper bonded film, and tested on the property of the copper-bonded laminated film. This copper-bonded film presented peeling strength as high as 1.90 kg/cm.

Then, tests were made for the chemical resistance and adaptability to electroplating. For this purpose, the copper-bonded film was subjected to resist-etching, thereby preparing a circuit. For the test of chemical resistance, 10 % solutions of HCl, $H_2SO_4$ and NaOH were used and the copper-bonded films were dipped therein for 15 minutes at a room temperature. Thereafter, the presence or absence of the side etching and an etched width due to etching were measured at the magnification of 20. Various tests for the adaptability to plating, soldering, tin-plating, gold-plating may be used. However, the gold-plating is most severe for the test. Ordinary gold cyanide plating was applied to find a blister, change in color, and side etching.

Table 4 shows the results of these tests. For comparison purpose, a copper-bonded film for use in a printed circuit, which has been prepared according to Example 2 was tested.

Table 4

|  | Chemical resisting[1] property | | | Adaptability to[2] electro-plating |
|---|---|---|---|---|
|  | HCl | $H_2SO_4$ | NaOH | |
| Copper foil according to Example 4 | A | A | A | A |
| Copper foil according to Example 2 | B | A | A | B |

Note:
[1] "A" represents freedom of side etching, and "B" represents presence of side etching.
[2] "A" represents absence of blister, change in color, side etching. "B" represents presence of one of these defects.

Although the present invention has been described with respect to specific details of certain embodiments thereof, it is not intended that such details be limitations upon the scope of the invention except insofar as set forth in the following claims.

What is claimed is:

1. A surface treating process for a copper foil for use in a printed circuit, comprising the step of subjecting a copper foil to a cathodic treatment in an electrolytic bath comprising a sulfuric acid aqueous solution containing nickel and copper ions, with said copper foil being used as a cathode, and thereby forming an electrodeposited layer on the surface of said copper foil, the color of said layer being dark brown, and said layer affording a metallic gloss.

2. A surface treating process as set forth in claim 1, wherein said layer includes nickel, copper and oxygen.

3. A surface treating process for a copper foil for use in a printed circuit, said process comprising the step of
    subjecting a copper foil to a cathodic treatment in an electrolytic bath comprising a sulfuric acid aqueous solution containing from about 20 to 70 gms/liter of nickel ions and from about 3 to 6 gms/liter of copper ions, with said copper foil being used as a cathode, thereby forming an electro-deposited layer on the surface of said copper 4. A surface treating process for a copper foil for use in a printed circuit, comprising the steps of:
    subjecting a copper foil to a cathodic treatment in an electrolytic bath comprising a sulfuric acid aqueous solution containing nickel and copper ions, with said copper foil being used as a cathode, thereby forming a deposited layer on said copper foil; and thereafter bringing said copper foil into contact with an aqueous solution containing one of sodium hexametaphosphate, α-nitroso R salt, 2-mercaptobenzothiazole, rubeanic acid, anthranilic acid, benzensulfonamide, phthalic acid, and postassium dichromate.

5. A surface treating process for a copper foil for use in a printed circuit, comprising the step of subjecting a copper foil to a cathodic treatment in an electrolytic bath comprising a sulfuric acid aqueous solution containing nickel ions, copper ions and polyacrylamide, with said copper foil being used as a cathode, thereby forming a deposited layer on said copper foil.

6. A surface treating process as set forth in claim 5 wherein said copper foil is a rolled copper foil, and, prior to said cathodic treatment, said rolled copper foil is subjected to a cleaning process and a layer of copper is electro-deposited on said cleaned copper foil.

7. A surface treating process as set forth in claim 5, wherein said copper foil thus subjected to said cathodic treatment is then brought into contact with an aqueous solution containing one of sodium hexametaphosphate, α-nitroso R salt, 2-mercaptobenzothiazole, rubeanic acid, anthranilic acid, benzensulfonamide, phthalic acid, and postassium dichromate.

* * * * *